(12) United States Patent
Trinh et al.

(10) Patent No.: US 7,968,182 B2
(45) Date of Patent: Jun. 28, 2011

(54) COATED INSERT

(75) Inventors: David Huy Trinh, Linköping (SE);
Hans Högberg, Linköping (SE); Lars Hultman, Linköping (SE); Marianne Collin, Älvsjö (SE); Ingrid Reineck, Segeltorp (SE)

(73) Assignee: Sandvik Intellectual Property AB, Sandviken (SE)

( * ) Notice: Subject to any disclaimer, the term of this patent is extended or adjusted under 35 U.S.C. 154(b) by 824 days.

(21) Appl. No.: 11/405,018

(22) Filed: Apr. 17, 2006

(65) Prior Publication Data

US 2006/0257691 A1    Nov. 16, 2006

(30) Foreign Application Priority Data

Apr. 18, 2005 (SE) .............................. 0500867
Jan. 19, 2006 (SE) .............................. 0600104

(51) Int. Cl.
*B32B 9/00* (2006.01)
(52) U.S. Cl. ............ 428/325; 51/307; 51/309; 428/216; 428/336; 428/697; 428/701; 428/702
(58) Field of Classification Search ................. 51/307, 51/309; 428/216, 325, 336, 472, 697, 698, 428/701, 702
See application file for complete search history.

(56) References Cited

U.S. PATENT DOCUMENTS

| | | | |
|---|---|---|---|
| 4,180,400 A * | 12/1979 | Smith et al. .................... | 428/469 |
| 4,218,253 A | 8/1980 | Dworak et al. | |
| 4,346,123 A | 8/1982 | Kaufmann ....................... | 427/38 |
| 4,619,866 A | 10/1986 | Smith et al. .................... | 428/336 |
| 4,701,384 A | 10/1987 | Sarin et al. ..................... | 428/688 |
| 4,702,907 A | 10/1987 | Becker et al. ................... | 424/88 |
| 4,702,970 A | 10/1987 | Sarin et al. | |
| 4,746,563 A * | 5/1988 | Nakano et al. ................ | 428/216 |
| 4,772,576 A | 9/1988 | Kimura et al. | |
| 4,965,231 A | 10/1990 | Mehrotra et al. | |
| 5,059,095 A | 10/1991 | Kushner et al. | |
| 5,122,317 A | 6/1992 | Chen et al. | |
| 5,147,731 A * | 9/1992 | Gilmore et al. ............... | 428/697 |
| 5,231,060 A | 7/1993 | Brandt | |
| 5,418,197 A | 5/1995 | Brandt | |
| 5,587,233 A | 12/1996 | König et al. | |
| 5,616,526 A | 4/1997 | Andersson et al. | |

(Continued)

FOREIGN PATENT DOCUMENTS

DE         27 36 982         3/1979

(Continued)

OTHER PUBLICATIONS

Qadri et al "Structural stability of ZrO2-Al2O3 thin films deposirited by magnetron sputtering" J. Vac Sci. Tech A 7 (3) May/Jun. 1989 p. 1220-1224.*

(Continued)

*Primary Examiner* — Archene Turner
(74) *Attorney, Agent, or Firm* — Drinker Biddle & Reath, LLP

(57) ABSTRACT

The present invention relates to cutting tool insert for metal machining on which at least on the functioning parts of the surface thereof a thin, adherent, hard and wear resistant coating is applied. The coating comprises a metal oxide/oxide composite layer consisting of two components with a grain size of from about 1 to about 100 nm. The oxide layer is under a compressive stress.

17 Claims, 1 Drawing Sheet

U.S. PATENT DOCUMENTS

| | | | |
|---|---|---|---|
| 5,688,729 | A | 11/1997 | Andersson et al. |
| 5,827,570 | A * | 10/1998 | Russell .................. 427/255.34 |
| 5,955,390 | A | 9/1999 | Mehrotra et al. |
| 5,985,427 | A | 11/1999 | Ueda et al. |
| 6,660,371 | B1 | 12/2003 | Westphal et al. ............. 428/216 |
| 7,326,461 | B2 | 2/2008 | Sottke et al. |
| 2005/0026032 | A1 | 2/2005 | Morishita et al. |

FOREIGN PATENT DOCUMENTS

| | | |
|---|---|---|
| DE | 102 51 404 | 4/2004 |
| EP | 0 252 046 B1 | 1/1988 |
| EP | 0 296 133 B1 | 12/1988 |
| JP | 61-201778 | 9/1986 |
| WO | 93/20257 | 10/1993 |
| WO | 99/29920 | 6/1999 |
| WO | 00/17416 | 3/2000 |
| WO | 2004/029321 | 4/2004 |

OTHER PUBLICATIONS

Andritschky et al "Thermal stability of zirconia/alumina thin coatings produced by magnetron sputtering" Surf. and Coat. Tech 94-95 (1997) p. 144-148.*

Teixeira et al "Deposition of composite and nanolaminate ceramic coatings by sputtering" Vacuum (2002) p. 477-483.*

Klostermann et al "Nanocomposite oxide and nitride hard coatings produced by pulse magetron sputteringz" Surf & Coat. Techn. 200 (2005) p. 760-764.*

Hannink et al., "Transformation Toughening in Zirconia-Containing Ceramics," J. Am. Ceram. Soc., 83 [3] 461-87 (2000).

Anthony G. Evans, "Perspective on the Development of High-Toughness Ceramics", J. Am. Ceram. Soc., 73 [2] 187-206 (1990).

Tomaszewski et al., "Influence of oxygen content in a sintering atmosphere on the phase composition and mechanical properties of $Al_2O_3$-10 wt % $ZrO_2$ ceramics", Journal of Materials Science Letters 7 (1988) 778-780.

Amor et al., "Characterization of zirconia films deposited by r.f. magnetron sputtering," Materials Science and Engineering B57 (1998) 28-39.

Kuntz et al., "Nanocrystalline-Matrix Ceramic Composites for Improved Fracture Toughneess", MRS Bulletin, Jan. 2004, pp. 22-27, XP008078761.

K. Czechowski et al., "Effect of nitride nano-scale multilayer coatings on functional properties of composite ceramic cutting insers," *Bulletin of the Polish Academy of Sciences*, vol. 53, No. 4, (2005), pp. 425-431.

Yibran Argenis Perera Mercado, "Diamond-like carbon and ceramic materials as protective coatings grown by pulsed laser deposition", Dec. 9, 2003, 110 pages.

Kirk-Othmer, "Encyclopedia of Chemical Technology", $4^{th}$ Edition, vol. 1, (1991), pp. 634-639.

A. Portinha et al., "Hard $ZrO_2/Al_2O_3$ nanolaminated PVD coatings evaluated by Nanoindentation", *Surface & Coatings Technology*, vol. 200, (2005), pp. 765-768.

S. El Hajjaji et al., "Investigations on composition and morphology of electrochemical alumina and alumina-yttria stabilised zirconia deposits", *Applied Surface Science*, vol. 180, (2001), pp. 293-301.

A. Portinha et al., "Mechanical Properties of $ZrO_2$—$Al_2O_3$ Nanostructured PVD Coatings Evaluated by Nanoindentation", *Rev. Adv. Mater. Sci.*, vol. 5, (2003), pp. 311-318.

Notice of opposition to a European patent No. 1 717 347 B1 dated Apr. 15, 2010.

H. Guo et al., "Preparation of $Al_2O_3$—YSZ composite coating by EB-PVD", *Materials Science and Engineering*, vol. A325, (2002), pp. 389-393.

Japanese Search Report for Japanese patent application No. 2006-114771, with English Translation.

* cited by examiner

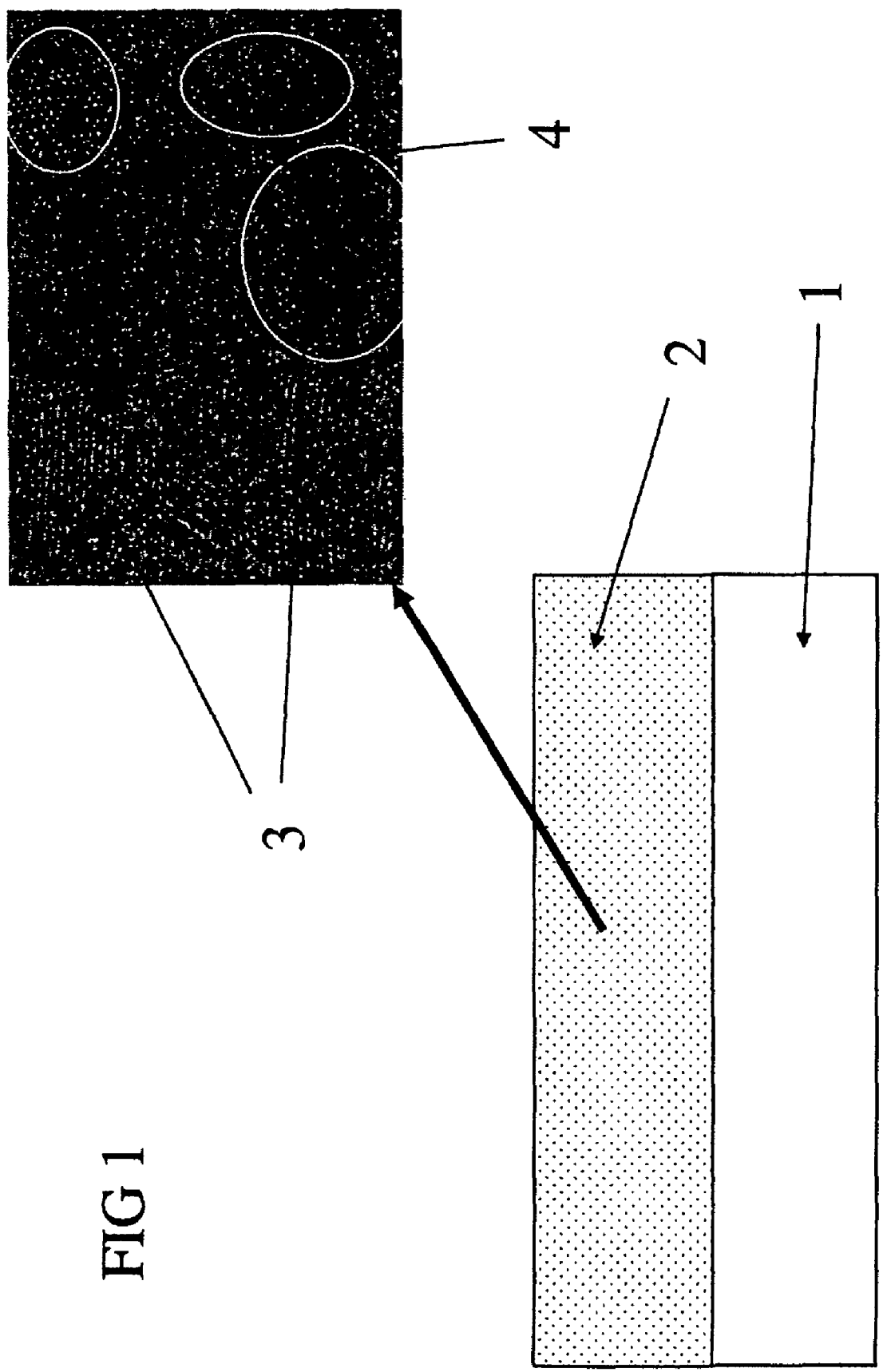

COATED INSERT

BACKGROUND OF THE INVENTION

The present invention relates to a coated cutting tool for metal machining, having a substrate of a hard alloy and, on the surface of said substrate, a hard and wear resistant refractory coating is deposited by Physical Vapor Deposition (PVD). The coating is adherently bonded to the substrate and is composed of a composite layer having at least two phases, the layer being under compressive stress. The layer comprises a metal oxide/oxide composite consisting of two components with different composition and different structure. The composite layer grain size is in the nanometer scale.

The process of depositing thin ceramic coatings (from about 1 to about 20 μm) of materials like alumina, titanium carbides and/or nitrides onto, e.g., a cemented carbide cutting tool is a well established technology and the tool life of the coated cutting tool, when used in metal machining, is considerably prolonged. The prolonged service life of the tool may under certain conditions extend up to several hundred percent greater than that of an uncoated cutting tool. These ceramic coatings generally comprise either a single layer or a combination of layers. Modern commercial cutting tools are characterized by a plurality of layer combinations with double or multilayer structures. The total coating thickness varies between from about 1 to about 20 μm and the thickness of the individual sublayers varies between a few micrometers down to some hundredths of a micrometer.

The established technologies for depositing such layers are CVD and PVD (see, e.g., U.S. Pat. Nos. 4,619,866 and 4,346,123). PVD coated commercial cutting tools of cemented carbides or high speed steels usually have a single layer of TiN, Ti(C,N) or (Ti,Al)N, homogeneous in composition, or multilayer coatings of said phases, each layer being a one phase material.

There exist several PVD techniques capable of producing thin, refractory coatings on cutting tools. The most established methods are ion plating, magnetron sputtering, arc discharge evaporation and IBAD (Ion Beam Assisted Deposition) as well as hybrid processes of the mentioned methods. Each method has its own merits and the intrinsic properties of the produced layers such as microstructure and grain size, hardness, state of stress, cohesion and adhesion to the underlying substrate may vary depending on the particular PVD method chosen. An improvement in the wear resistance or the edge integrity of a PVD coated cutting tool being used in a specific machining operation can thus be accomplished by optimizing one or several of the above mentioned properties.

Particle strengthened ceramics are well known as construction materials in bulk form, however, not as nanocomposites until recently. Alumina bulk ceramics with different nanodispersed particles are disclosed in J. F. Kuntz et al, MRS Bulletin January 2004, pp 22-27. Zirconia and titania toughened alumina CVD layers are disclosed in for example U.S. Pat. Nos. 6,660,371, 4,702,907 and 4,701,384. In these latter disclosures, the layers are deposited by CVD technique and hence the $ZrO_2$ phase formed is the thermodynamically stable phase, namely the monoclinic phase. Furthermore, the CVD deposited layers are in general under tensile stress or low level compressive stress, whereas PVD layers are typically under high level compressive stress due to the inherent nature of the PVD process. In DE 10251404, blasting of alumina/zirconia CVD layers is described to give a compressive stress level. Blasting processes are known to introduce compressive stresses at moderate levels.

Metastable phases of zirconia, such as the tetragonal or cubic phases, have been shown to further enhance bulk ceramics through a mechanism known as transformation toughening (Hannink et al, J. Am. Ceram. Soc 83 (3) 461-87; Evans, Am. Ceram. Soc. 73 (2) 187-206 (1990)). Such metastable phases have been shown to be promoted by adding stabilizing elements such as Y or Ce or by the presence of an oxygen deficient environment, such as vacuum (Tomaszewski et al, J. Mater. Sci. Lett 7 (1988) 778-80), which is typically required for PVD applications. Variation of PVD process parameters has been shown to cause variations in the oxygen stoichiometry and the formation of metastable phases in zirconia, particularly the cubic zirconia phase (Ben Amor et al, Mater. Sci. Eng. B57 (1998) 28).

OBJECTS AND SUMMARY OF THE INVENTION

It is an object of this invention to avoid or alleviate the problems of the prior art.

In accordance with the invention there is provided a cutting tool insert comprising a body of cemented carbide, cermet, ceramics, cubic boron nitride or high speed steel on which at least on the functioning parts of the surface thereof a thin, adherent, hard and wear resistant coating is applied wherein said coating comprises at least one PVD layer of a metal oxide/oxide composite where the metal atoms are selected from Ti, Nb, V, Mo, Zr, Cr, Al, Hf, Ta, Y or Si and where said oxide layer has a total thickness of between from about 0.2 to about 20 μm and is composed of two components, component A and component B, with different composition and different structure, which components are a single phase oxide of one metal element or a solid solution of two or more metal oxides.

BRIEF DESCRIPTION OF THE FIGURE

FIG. 1 is a schematic representation of a cross section taken through a coated body of the present invention in which is shown a substrate (1) coated with an oxide/oxide composite layer (2) according to the invention. Inserted is a high resolution TEM image (Transmission Electron Microscopy) where component A (3) and component B (4) in the oxide composite layer are indicated.

DETAILED DESCRIPTION OF THE DRAWING

According to the present invention, there is provided a cutting tool insert for metal machining such as turning, milling and drilling comprising a body of a hard alloy of cemented carbide, cermet, ceramics, cubic boron nitride or high speed steel, preferably cemented carbide or cermet, onto which a wear resistant, multilayer coating has been deposited. The shape of the cutting tool includes indexable inserts as well as shank type tools such as drills, end mills etc. Said body may also be pre-coated with a single- or multilayer of metal carbides, nitrides or carbonitrides where the metal atoms are chosen from one or more of Ti, Nb, V, Mo, Zr, Cr, Al, Hf, Ta, Y or Si with a thickness in the range from about 0.2 to about 20 μm according to prior art. The coating is applied onto the entire body or at least the functioning surfaces thereof, e.g. the cutting edge, rake face, flank face and any other surfaces which participate in the metal cutting process.

The coating according to the invention is adherently bonded to the body and comprises at least one layer of a metal oxide/oxide composite where the metal atoms are selected from Ti, Nb, V, Mo, Zr, Cr, Al, Hf, Ta, Y or Si. Said oxide layer has a total thickness of between from about 0.2 to about 20

μm, preferably from about 0.5 to about 5 μm. The layer is composed of two components with different composition and different structure. Each component is a single phase oxide of one metal element or a solid solution of two or more metal oxides. The microstructure of the material is characterized by nanosized grains or columns with an average grain or column size of from about 1 to about 100 nm, preferably from about 1 to about 70 nm, most preferably from about 1 to about 20 nm (component A) surrounded by a component B. The mean linear intercept of component B is from about 0.5 to about 200 nm, preferably from about 0.5 to about 50 nm, most preferably from about 0.5 to about 20 nm. The preferred embodiment contains grains or columns of component A in the form of tetragonal or cubic zirconia and a surrounding component B in the form of amorphous or crystalline alumina. In an alternative embodiment, component B is crystalline alumina of the alpha (α)—and/or the gamma (γ)—phase. The compound oxide layer is understoichiometric in oxygen content with an oxygen:metal atomic ratio which is from about 85 to about 99%, preferably from about 90 to about 97%, of stoichiometric oxygen:metal atomic ratio. The volume contents of component A and B are from about 40 to about 95% and from about 5 to about 60% respectively. The layer also possesses a residual stress as a result of the method of production, the stress being compressive in the range of from about 200 to about 5000 MPa, preferably from about 1000 to about 3000 MPa.

Said coated body may also have an outer single or multi-layer coating of metal carbides, nitrides or carbonitrides where the metal atoms are chosen from one or more of Ti, Nb, V, Mo, Zr, Cr, Al, Hf, Ta, Y or Si. The thickness of this layer is from about 0.2 to about 5 μm.

The layer according to the present invention is made by a PVD technique or a hybrid of such techniques. Examples of such techniques are RF (Radio Frequency) magnetron sputtering, DC magnetron sputtering and pulsed dual magnetron sputtering (DMS). The layer is formed at a substrate temperature of from about 200 to about 850° C.

When the type of PVD process permits, the oxide layer is deposited using a composite oxide target material. A reactive process using metallic targets in an ambient reactive gas is an alternative process route. For the case of production of the metal oxide layer by a magnetron sputtering method, two or more single metal targets may be used where the metal oxide composition is steered by switching on and off of separate targets. In a preferred method, the target is a compound with a composition that reflects the desired layer composition. For the case of radio frequency (RF) sputtering, the composition is controlled by applying independently controlled power levels to the separate targets.

The invention is additionally illustrated in connection with the following examples, which are to be considered as illustrative of the present invention. It should be understood, however, that the invention is not limited to the specific details of the examples.

EXAMPLE 1

Nanocomposite $Al_2O_3+ZrO_2$ layers were deposited on a substrate using a RF sputtering PVD method with high purity oxide targets applying different process conditions in terms of temperature and zirconia to alumina ratio. The content of the two oxides in the formed layer was controlled by applying one power level on the zirconia target and a separate power level on the alumina target.

The resulting layers were analyzed by XRD and TEM. The XRD analysis showed no traces of crystalline $Al_2O_3$.

Growth at 450° C. of a pure $ZrO_2$ layer gave both the stable monoclinic phase as well as the metastable tetragonal phase. Adding alumina to the zirconia flux with the aim to form a composite material allowed the stabilization of metastable $ZrO_2$ phases. The target power level for this case was 80 W on each oxide target. The sputter rates were adjusted to obtain two times higher at % of zirconium compared to aluminium. The oxygen:metal atomic ratio was 94% of stoichiometric oxygen:metal atomic ratio.

The TEM investigation showed that the deposited layer was a metal oxide/oxide nanocomposite of grains with an average grain size of 4 nm (component A) surrounded by an amorphous phase with a linear intercept of 2 nm (component B). The grains were cubic $ZrO_2$ while the surrounding phase had high aluminium content.

EXAMPLE 2

Nanocomposite $Al_2O_3+ZrO_2$ layers were deposited on a substrate using a reactive RF sputtering PVD method with high purity Al and Zr targets in an argon and oxygen atmosphere. The content of the two oxides in the formed layer was controlled by applying one power level on the Zr target and a separate power level on the Al target. The sputter rates were adjusted with the aim to form a composite material with 1-2 times higher at % of zirconium.

The resulting layers were analyzed by XRD and TEM.

The XRD results showed presence of metastable $ZrO_2$ phases. The TEM investigation showed that the deposited layer was a metal oxide/oxide nanocomposite consisting of grains with an average grain size of 6 nm (component A) surrounded by an amorphous phase with a linear intercept of 3 nm (component B). The grains had a high zirconium content while the surrounding phase had high aluminium content.

EXAMPLE 3

Inserts were produced according to the following:
Composition: 86.1 weight-% WC+3.5 weight-% TaC+2.3 weight-% NbC+2.6 weight-% TiC+5.5 weight-% Co
Style: CNMG120408-PM
Sintering temperature: 1450° C.

The inserts were given a rounded edge and thereafter cleaned and coated with a 3.5 μm thick Ti(C,N)—layer using CVD—technique and a coating temperature of 885° C. whereafter the inserts were split into two variants. Variant A was plasma cleaned and subsequently PVD-coated with a nanocomposite according to Example 2. Variant B was plasma cleaned and subsequently PVD-coated with a zirconia layer in the same coating equipment. The thicknesses of the oxide layers were about 0.5 μm for both variants.

The inserts were tested in a turning operation in order to compare the wear resistance of the oxide layers according to the following:
Workpiece: Ovako 825B
Cutting depth: 2 mm
Feed: 0.30 mm/rev
Cutting Speed: 200 m/min
Cutting time: 10 minutes
Cooling fluid was used
Result (crater area):
Variant A: 0.54 mm$^2$
Variant B: 1.67 mm$^2$ These results indicate that the oxide layer of Variant A made according to the invention had the best wear resistance.

Although the present invention has been described in connection with preferred embodiments thereof, it will be appre-

The invention claimed is:

1. A cutting tool insert comprising a body of cemented carbide, cermet, ceramics, cubic boron nitride or high speed steel on which at least on the functioning parts of the surface thereof a thin, adherent, hard and wear resistant coating is applied wherein said coating comprises at least one PVD layer of an metal oxide/oxide composite where the metal atoms are selected from Ti, Nb, V, Mo, Zr, Cr, Al, Hf, Ta, Y or Si and where said oxide layer has a total thickness of between from about 0.2 to about 20 µm and is composed of two components, component A and component B, with different composition and different structure, which components are a single phase oxide of one metal element or a solid solution of two or more metal oxides, wherein said component A contains tetragonal or cubic zirconia and said component B contains crystalline or amorphous alumina, and wherein the volume contents of component A and B are from about 40 to about 95% and from about 5 to about 60% respectively.

2. A cutting tool insert according of claim 1 wherein the body has as a first, inner single or multilayer of metal carbides, nitrides or carbonitrides with a thickness between from about 0.2 and to about 20 µm where the metal atoms are chosen from one or more of Ti, Nb, V, Mo, Zr, Cr, Al, Hf, Ta, Y or Si.

3. A cutting tool insert of claim 1 wherein the body has as an outer single or multilayer coating of metal carbides, nitrides or carbonitrides with a thickness between from about 0.2 and to about 5 µm where the metal atoms are chosen from one or more of Ti, Nb, V, Mo, Zr, Cr, Al, Hf, Ta, Y or Si.

4. A cutting tool insert of claim 1 wherein said component A has an average grain size of from about 1 to about 100 nm.

5. A cutting tool insert of claim 4 wherein said component A has an average grain size of from about 1 to about 70 nm.

6. A cutting tool insert of claim 5 wherein said component A has an average grain size of from about 1 to about 20 nm.

7. The cutting tool insert of claim 4, wherein said component B surrounds said component A, and said component B has a mean linear intercept of from about 0.5 to about 200 nm.

8. A cutting tool insert of claim 1 wherein said component B has a mean linear intercept of from about 0.5 to about 200 nm.

9. A cutting tool insert of claim 8 wherein said component B has a mean linear intercept of from about 0.5 to about 50 nm.

10. A cutting tool insert of claim 9 wherein said component B has a mean linear intercept of about 0.5 nm.

11. A cutting tool insert of claim 1 wherein said component B consists essentially of crystalline alumina of the alpha ($\alpha$)-and/or the gamma ($\gamma$)-phase.

12. A cutting tool insert of claim 1 wherein the oxygen:metal atomic ratio in the oxide layer is from about 85% to about 99% of the stoichiometric oxygen:metal atomic ratio.

13. A cutting tool insert of claim 1 wherein the oxygen:metal atomic ratio is from about 90 to 97% of the stoichiometric oxygen:metal atomic ratio.

14. A cutting tool insert of claim 1 wherein said body is a cemented carbide or a cermet.

15. The cutting tool insert of claim 1, wherein the oxide layer includes stress being compressive in the range of from about 200 to about 5000 MPa.

16. The cutting tool insert of claim 1, wherein said component A is in the form of nanosized grains or columns and said component B surrounds said component A.

17. A cutting tool insert comprising a body of cemented carbide, cermet, ceramics, cubic boron nitride or high speed steel on which at least on the functioning parts of the surface thereof a thin, adherent, hard and wear resistant coating is applied wherein said coating comprises at least one PVD layer of an metal oxide/oxide composite where the metal atoms are selected from Ti, Nb, V, Mo, Zr, Cr, Al, Hf, Ta, Y or Si and where said oxide layer has a total thickness of between from about 0.2 to about 20 µm and is composed of two components, component A and component B, with different composition and different structure, which components are a single phase oxide of one metal element or a solid solution of two or more metal oxides, wherein said component A contains tetragonal or cubic zirconia and said component B contains crystalline or amorphous alumina, wherein when component A contains tetragonal zirconia then said component B contains crystalline alumina and when component A contains cubic zirconia the said component B contains amorphous alumina, and wherein the volume contents of component A and B are from about 40 to about 95% and from about 5 to about 60% respectively.

* * * * *